(12) United States Patent
Wu et al.

(10) Patent No.: US 11,855,202 B2
(45) Date of Patent: *Dec. 26, 2023

(54) LDMOS TRANSISTOR

(71) Applicant: Taiwan Semiconductor Manufacturing Company, Ltd., Hsinchu (TW)

(72) Inventors: Chun-Ching Wu, Tainan (TW); Po-Jen Wang, Taichung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 231 days.

This patent is subject to a terminal disclaimer.

(21) Appl. No.: 17/028,998

(22) Filed: Sep. 22, 2020

(65) Prior Publication Data

US 2021/0005747 A1 Jan. 7, 2021

Related U.S. Application Data

(63) Continuation of application No. 15/054,078, filed on Feb. 25, 2016, now Pat. No. 10,804,389.

(51) Int. Cl.
| | |
|---|---|
| *H01L 29/78* | (2006.01) |
| *H01L 29/66* | (2006.01) |
| *H01L 27/088* | (2006.01) |
| *H01L 29/10* | (2006.01) |
| *H01L 29/40* | (2006.01) |
| *H01L 29/423* | (2006.01) |

(52) U.S. Cl.
CPC ........ *H01L 29/7823* (2013.01); *H01L 27/088* (2013.01); *H01L 29/1095* (2013.01); *H01L 29/402* (2013.01); *H01L 29/4232* (2013.01); *H01L 29/66681* (2013.01); *H01L 29/7816* (2013.01); *H01L 29/7835* (2013.01); *H01L 29/1045* (2013.01)

(58) Field of Classification Search
CPC ........... H01L 29/7816; H01L 29/66681; H01L 29/402
See application file for complete search history.

(56) References Cited

U.S. PATENT DOCUMENTS

| | | | | |
|---|---|---|---|---|
| 10,804,389 | B2* | 10/2020 | Wu | ............... H01L 29/4232 |
| 2011/0278671 | A1* | 11/2011 | Lin | ............... H01L 29/41725 |
| | | | | 257/E27.06 |
| 2014/0239371 | A1* | 8/2014 | Tan | ............... H01L 29/66681 |
| | | | | 438/591 |
| 2015/0236150 | A1* | 8/2015 | Chen | ............... H01L 29/402 |
| | | | | 327/109 |
| 2016/0181378 | A1* | 6/2016 | Gao | ............... H01L 29/4175 |
| | | | | 438/286 |

* cited by examiner

*Primary Examiner* — Raj R Gupta
(74) *Attorney, Agent, or Firm* — JCIPRNET

(57) ABSTRACT

A MOS transistor includes a substrate, a first region, a second region, a source region, a drain region, an active gate stack, and a dummy gate stack. The substrate has a first conductivity. The first region having the first conductivity is formed in the substrate. The second region having a second conductivity is formed in the substrate and is adjacent to the first region. The source region with the second conductivity is formed in the first region. The drain region with the second conductivity is formed in the second region. The active gate stack is disposed on the first region. The dummy gate stack is disposed on the second region, and the dummy gate stack is electrically coupled to a variable voltage.

20 Claims, 6 Drawing Sheets

LDMOS TRANSISTOR

CROSS-REFERENCE TO RELATED APPLICATION

This application is a continuation application of U.S. application Ser. No. 15/054,078, filed on Feb. 25, 2016, now allowed. The entirety of each of the above-mentioned patent applications is hereby incorporated by reference herein and made a part of this specification.

BACKGROUND

MOSFETs are voltage controlled devices. When a control voltage greater than the threshold of the MOSFET is applied to the gate of a MOSFET, a conductive channel is built between a drain and a source of the MOSFET. On the other hand, when the control voltage is less than the threshold of the MOSFET, the MOSFET is turned off accordingly. Currently, MOSFETs are divided into three sub-categories, planar MOSFETs, lateral double diffused MOS (LDMOS) FETs and vertical double diffused MOSFETs. In comparison with other MOSFETs, the LDMOS is capable of delivering more current per unit area because its asymmetric structure provides a short channel between the drain and the source of the LDMOS. In order to increase the breakdown voltage of the LDMOS, the gate poly-silicon of the LDMOS may be extended to make an overlap with the drift region of the LDMOS. Such an overlap functions as a field plate to maintain the breakdown voltage of the LDMOS.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
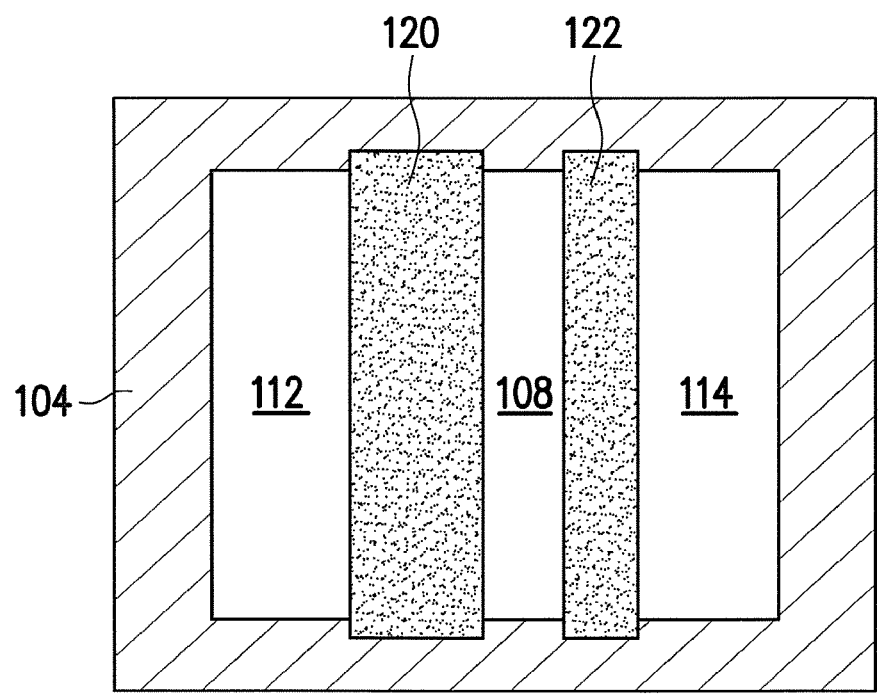
FIG. 1 is a top view of a LDMOS transistor in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to some embodiments in a specific context, a high voltage lateral double diffused metal oxide semiconductor (LDMOS) transistor. The embodiments of the disclosure may also be applied to a variety of metal oxide semiconductor field effect transistors (MOSFETs). In accordance with one embodiment of the disclosure, the first conductivity is p-type and the second conductivity is n-type. In accordance with another embodiment of the disclosure, the first conductivity is n-type and the second conductivity is p-type.

Figure 2:
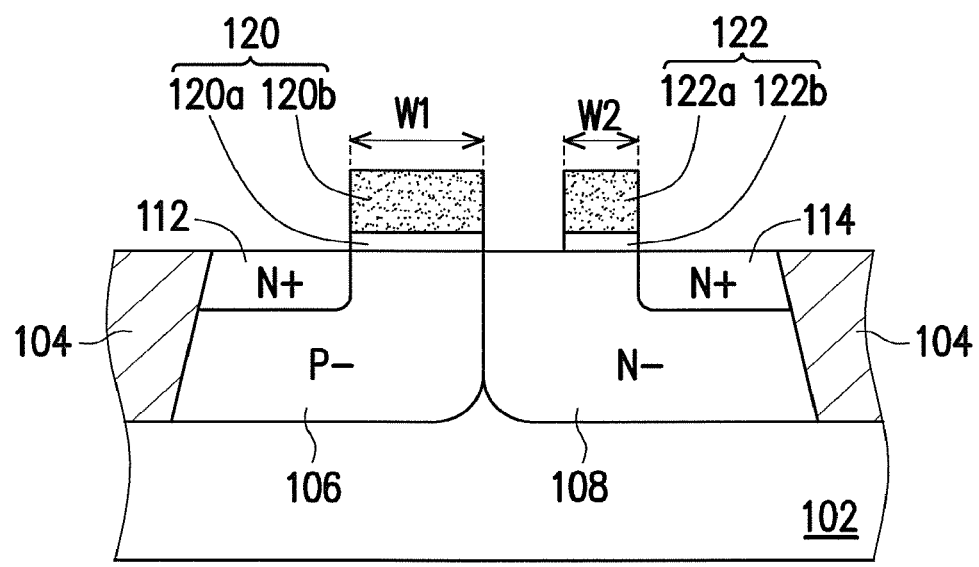
FIG. 2 is a cross-sectional view of a LDMOS transistor in accordance with some embodiments.

FIG. 1 is a top view of a LDMOS transistor in accordance with some embodiments and FIG. 2 is a cross-sectional view of the LDMOS transistor of FIG. 1. Referring to FIG. 1 and FIG. 2, the LDMOS includes a substrate 102, a first region 106, a second region 108, a source region 112, a drain region 114, an active gate stack 120, and a dummy gate stack 122. In some embodiments, the LDMOS further includes an isolator 104.

The substrate 102 comprises a crystalline silicon substrate (e.g., wafer). In some alternative embodiments, the substrate 102 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. The substrate 102 may be a p-type substrate configured for an n-type LDMOS or an n-type substrate configured for a p-type LDMOS. In some embodiments, the substrate 102 may be doped with p-type dopants, such as boron or $BF_2$; or n-type dopants, such as phosphorus or arsenic. In order to illustrate the present disclosure, an n-type LDMOS is drawn in the figures as an example, the substrate 102 for the n-type LDMOS is a p-type substrate, and the present disclosure does not limit thereto.

The first region 106 is formed in the substrate 102. In accordance with some embodiments, the first region 106 is formed by implanting p-type doping materials such as boron, gallium, aluminum, indium, combinations thereof, or the like. In one embodiment, a p-type material such as boron may be implanted to a doping density of about $10^{15}/cm^3$ to $10^{18}/cm^3$. The first region 106 can be a P− region and may be referred as a channel region.

The second region 108 is formed in the substrate 102 and is adjacent to the first region 106. In accordance with some embodiments, the second region 108 is formed by implanting n-type doping materials such as phosphorous, arsenic, nitrogen, antimony, combination thereof, or the like. In one embodiment, an n-type material such as phosphorous may be implanted to a doping density of about $10^{15}/cm^3$ to $10^{18}/cm^3$. The second region 108 can be an N− region and may be referred to as an extended drift region.

The source region 112 is formed in the first region 106. In one embodiment, the source region 112 may be formed by implanting an n-type dopant, such as phosphorous at a concentration of between about $10^{19}/cm^3$ and about $10^{20}/cm^3$. The source region 112 can be an N+ region.

The drain region 114 is formed in the second region 108. In one embodiment, the drain region 114 may be formed by implanting an n-type dopant, such as phosphorous at a concentration of between about $10^{19}/cm^3$ and about $10^{20}/cm^3$. The drain region 114 can also be an N+ region.

The isolator 104 is used to isolate active regions so as to prevent leakage current from flowing between adjacent active regions. The isolator 104 may include silicon oxide, silicon nitride, silicon oxynitride, or a low-K dielectric material. The isolator 104 may be formed by a thermally growing process or by a depositing process such as high-density-plasma chemical vapor deposition (HDP-CVD). In this embodiment, the isolator 104 may be fabricated by a shallow trench isolation (STI) process.

The active gate stack 120 is disposed on the first region 106. The active gate stack 120 comprises a gate dielectric layer 120a and a gate electrode layer 120b. In some embodiments, the gate dielectric layer 120a may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric layer 120a may be formed using a suitable process such as atomic layer deposition (ALD), chemical vapor deposition (CVD), physical vapor deposition (PVD), thermal oxidation, UV-ozone oxidation, or combinations thereof. The gate electrode layer 120b is disposed on the gate dielectric layer 120a. In some embodiments, the gate electrode layer 120b may comprise a single layer or multi-layered structure. In some embodiments, the gate electrode layer 120b may comprise poly-silicon or metal, such as Al, Cu, W, Ti, Ta, TiN, TiAl, TiAlN, TaN, NiSi, CoSi, other conductive materials with a work function compatible with the substrate material, or combinations thereof. The gate electrode layer 120b may be formed using a suitable process such as ALD, CVD, PVD, plating, or combinations thereof. In accordance with some embodiments, the active gate stack 120 may further comprise spacers on sidewalls of the gate dielectric layer 120a and the gate electrode layer 120b.

The dummy gate stack 122 is disposed on the second region 108. The dummy gate stack 122 comprises a gate dielectric layer 122a and a gate electrode layer 122b. In some embodiments, the gate dielectric layer 122a may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric layer 122a may be formed using a suitable process such as atomic layer deposition (ALD), chemical vapor deposition (CVD), physical vapor deposition (PVD), thermal oxidation, UV-ozone oxidation, or combinations thereof. The gate electrode layer 122b is disposed on the gate dielectric layer 122a. In some embodiments, the gate electrode layer 122b may comprise a single layer or multi-layered structure. In some embodiments, the gate electrode layer 122b may comprise poly-silicon or metal, such as Al, Cu, W, Ti, Ta, TiN, TiAl, TiAlN, TaN, NiSi, CoSi, other conductive materials with a work function compatible with the substrate material, or combinations thereof. The gate electrode layer 122b may be formed using a suitable process such as ALD, CVD, PVD, plating, or combinations thereof. In accordance with some embodiments, the active gate stack 122 may further comprise spacers on sidewalls of the gate dielectric layer 122a and the gate electrode layer 122b.

In one embodiment, the active gate stack 120 and the dummy gate stack 122 are formed with the same photomask process. Therefore, a material of the gate dielectric layer 120a is the same with a material of the gate dielectric layer 122a, and a material of the gate electrode layer 120a is the same with a material of the gate electrode layer 122b. A thickness of the gate dielectric layer 120a is substantially equal to a thickness of the gate dielectric layer 122a, and a thickness of the gate electrode layer 120a is substantially equal to a thickness of the gate electrode layer 122b.

In accordance with some embodiments, a width W2 of the dummy gate stack 122 is smaller than a width W1 of the active gate stack 120. The width W2 of the dummy gate stack 122 ranges from 40 nm to 130 nm, for example, and the width W1 of the active gate stack 120 ranges from 500 nm to 10 um, for example. In one embodiment, the active gate stack 106 overlaps with the first region 106 and does not overlap with the second region 108, but the disclosure does not limit thereto.

The active gate stack 120 is electrically coupled to a bias voltage for a LDMOS transistor, and the dummy gate stack 122 is electrically coupled to a variable voltage. The variable voltage applied to the dummy gate stack 122 may adjust a resistance of the second region 108 underneath the dummy gate stack 122. Thus, a breakdown voltage (BVdss) of the LDMOS transistor can be adjusted for different demands. The breakdown voltage (BVdss) is a voltage at which currents start to flow between the source region and the drain region. Since the dummy gate stack 122 is electrically coupled to a variable voltage, the resistance of the LDMOS transistor is variable, such that it is flexible for designers to apply different breakdown voltage (BVdss) for the single LDMOS transistor.

Figure 3:
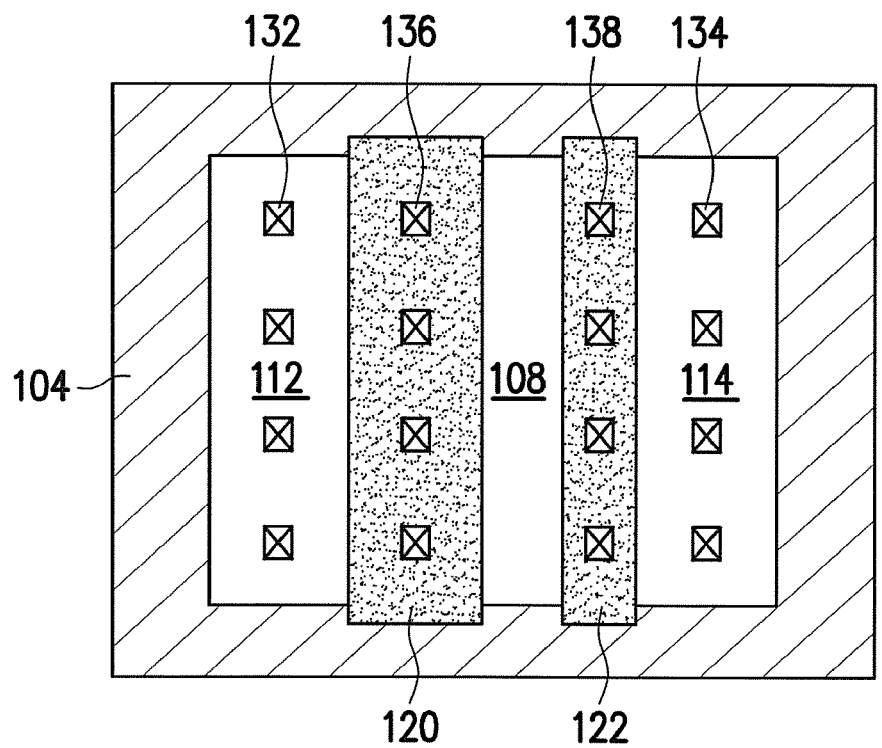
FIG. 3 is a top view of a LDMOS transistor with contact structures in accordance with some embodiments.
Figure 4:
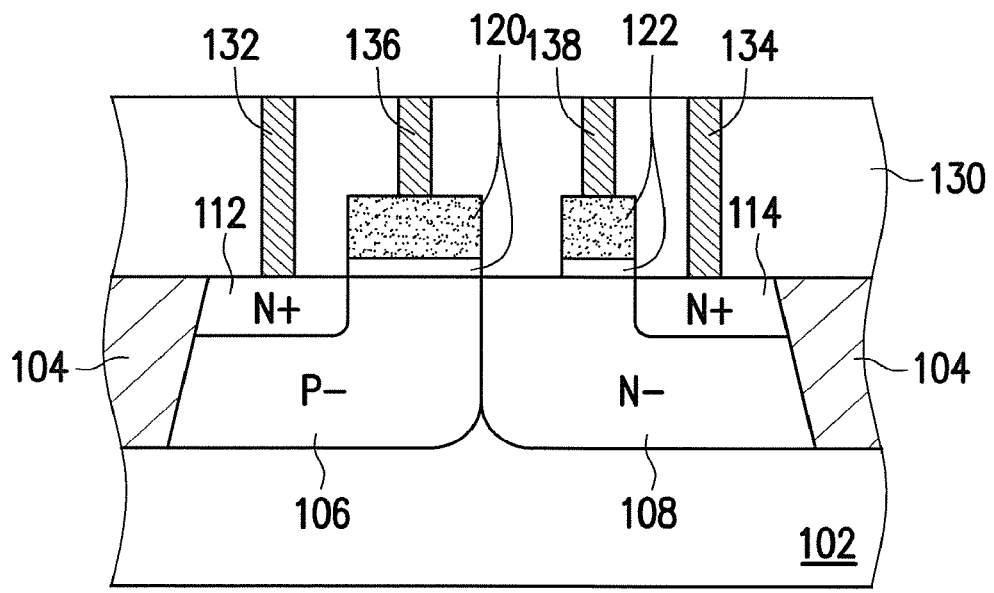
FIG. 4 is a cross-sectional view of a LDMOS transistor with contact structures in accordance with some embodiments.

FIG. 3 is a top view of a LDMOS transistor with contact structures in accordance with some embodiments. FIG. 4 is a cross-sectional view of a LDMOS transistor of FIG. 3. After forming the active gate stack 120 and the dummy gate stack 122, as shown in FIG. 3 and FIG. 4, an insulating layer 130 is formed over the source 112, the drain 114, the isolator 104, the active gate stack 120 and the dummy gate stack 122. The insulating layer 130 may include silicon oxide, silicon nitride, silicon oxynitride, a spin-on dielectric material, or a low-K dielectric material. The insulating layer 130 may be formed by high-density-plasma chemical vapor deposition (HDP-CVD), sub-atmospheric CVD (SACVD) or by spin-on. Contact structures 132, 134, 136, 138 are formed in the insulating layer 130 and may be electrically connected to the source region 112, the drain region 114, the active gate stack 120 and the dummy gate stack 122 respectively. The contact structure 132 may be referred as a source contact, the drain structure 134 may be referred as a drain contact, the contact structure 136 may be referred as a gate contact, and the contact structure 138 may be referred as a dummy gate contact.

Figure 5:
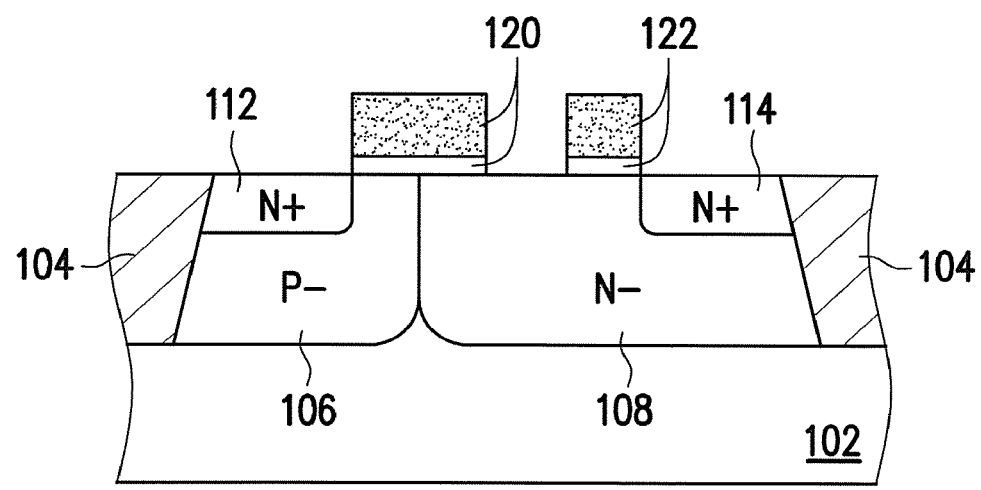
FIG. 5 is a cross-sectional view of a LDMOS transistor in accordance with some embodiments.

FIG. 5 is a cross-sectional view of a LDMOS transistor in accordance with some embodiments. The LDMOS transistor shown in FIG. 5 is a modified embodiment of the LDMOS transistor in FIG. 2. For details, in the LDMOS transistor shown in FIG. 2, the active gate stack 120 overlaps with the first region 106 and does not overlap with the second region 108. However, in the LDMOS transistor shown in FIG. 5, the active gate stack 120 partially overlaps with the first region 106 and partially overlaps with the second region 108.

Figure 6:
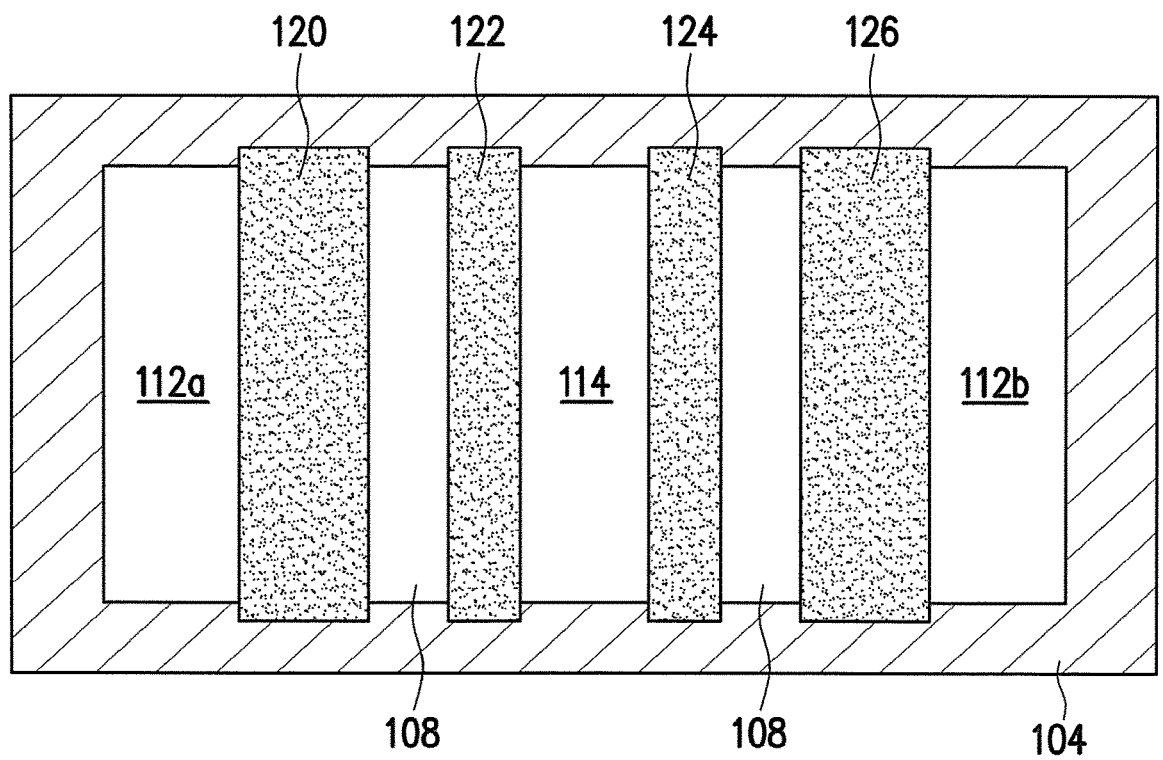
FIG. 6 is a top view of a LDMOS transistor in accordance with some embodiments.
Figure 7:
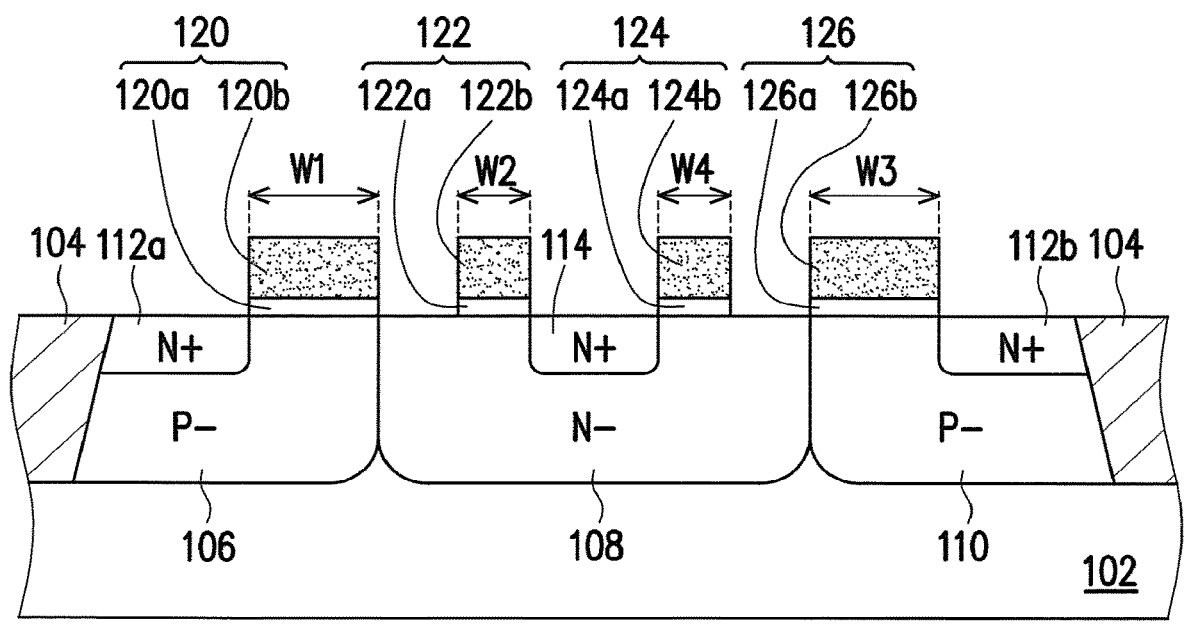
FIG. 7 is a cross-sectional view of a LDMOS transistor in accordance with some embodiments.

FIG. 6 is a top view of a LDMOS transistor in accordance with some embodiments. FIG. 7 is a cross-sectional view of a LDMOS transistor of FIG. 6. Referring to FIG. 6 and FIG. 7, the LDMOS includes a substrate 102, a first region 106, a second region 108, a third region 110, a first source region 112a, a drain region 114, a second source region 112b, a first active gate stack 120, a second active gate stack 126, a first dummy gate stack 122, and a second dummy gate stack 124. In some embodiments, the LDMOS further includes an isolator 104.

The substrate 102 comprises a crystalline silicon substrate (e.g., wafer). In some alternative embodiments, the substrate 102 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. The substrate 102 may be a p-type substrate configured for an n-type LDMOS or an n-type substrate configured for a p-type LDMOS. In some embodiments, the substrate 102 may be doped with p-type dopants, such as boron or $BF_2$; or n-type dopants, such as phosphorus or arsenic. In order to illustrate the present disclosure, an n-type LDMOS is drawn in the figures as an example, and the substrate 102 for the n-type LDMOS is a p-type substrate.

The first region 106 is formed in the substrate 102. In accordance with some embodiments, the first region 106 is formed by implanting p-type doping materials such as boron, gallium, aluminum, indium, combinations thereof, or the like. In some embodiments, a p-type material such as boron may be implanted to a doping density of about $10^{15}/cm^3$ to $10^{18}/cm^3$. The first region 106 can be a P– region and may be referred as a channel region.

The second region 108 is formed in the substrate 102 and is adjacent to the first region 106. In accordance with some embodiments, the second region 108 is formed by implanting n-type doping materials such as phosphorous, arsenic, nitrogen, antimony, combination thereof, or the like. In one embodiment, an n-type material such as phosphorous may be implanted to a doping density of about $10^{15}/cm^3$ to $10^{18}/cm^3$. The second region 108 can be an N– region and may be referred to as an extended drift region.

The third region 110 is formed in the substrate 102 and is adjacent to the second region 108, such that the second region 108 is formed between the first region 106 and the third region 110. In accordance with some embodiments, the third region 110 is formed by implanting p-type doping materials such as boron, gallium, aluminum, indium, combinations thereof, or the like. In one embodiment, a p-type material such as boron may be implanted to a doping density of about $10^{15}/cm^3$ to $10^{18}/cm^3$. The third region 110 can be a P– region and may also be referred as a channel region.

The first source region 112a is formed in the first region 106. In one embodiment, the first source region 112a may be formed by implanting an n-type dopant, such as phosphorous at a concentration of between about $10^{19}/cm^3$ and about $10^{20}/cm^3$. The first source region 112a can be an N+ region.

The drain region 114 is formed in the second region 108. In one embodiment, the drain region 114 may be formed by implanting an n-type dopant, such as phosphorous at a concentration of between about $10^{19}/cm^3$ and about $10^{20}/cm^3$. The drain region 114 can also be an N+ region.

The second source region 112b is formed in the third region 110. In one embodiment, the second source region 112b may be formed by implanting an n-type dopant, such as phosphorous at a concentration of between about $10^{19}/cm^3$ and about $10^{20}/cm^3$. The second source region 112b can also be an N+ region.

The isolator 104 is used to isolate active regions so as to prevent leakage current from flowing between adjacent active regions. The isolator 104 may include silicon oxide, silicon nitride, silicon oxynitride, or a low-K dielectric material. The isolator 104 may be formed by a thermally growing process or by a depositing process, such as high-density-plasma chemical vapor deposition (HDP-CVD). In this embodiment, the isolator 104 may be fabricated by a shallow trench isolation (STI) process.

The first active gate stack 120 is disposed on the first region 106, and the second active gate stack 126 is disposed on the third region 110. The first active gate stack 120 comprises a gate dielectric layer 120a and a gate electrode layer 120b, and the second active gate stack 126 comprises a gate dielectric layer 126a and a gate electrode layer 126b. The first dummy gate stack 122 is disposed on the second region 108, and the second dummy gate stack 124 is also disposed on the second region 108. The first dummy gate stack 122 comprises a gate dielectric layer 122a and a gate electrode layer 122b, and the second dummy gate stack 124 comprises a gate dielectric layer 124a and a gate electrode layer 124b.

In some embodiments, the gate dielectric layers 120a, 122a, 124a, 126a may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric layers 120a, 122a, 124a, 126a may be formed using a suitable process such as atomic layer deposition (ALD), chemical vapor deposition (CVD), physical vapor deposition (PVD), thermal oxidation, UV-ozone oxidation, or combinations thereof. In some embodiments, the gate electrode layers 120b, 122b, 124b, 126b may respectively comprise a single layer or multi-layered structure. In some embodiments, the gate electrode layer 120b may comprise poly-silicon or metal, such as Al, Cu, W, Ti, Ta, TiN, TiAl, TiAlN, TaN, NiSi, CoSi, other conductive materials with a work function compatible with the substrate material, or combinations thereof. The gate electrode layers 120b, 122b, 124b, 126b may be formed using a suitable process such as ALD, CVD, PVD, plating, or combinations thereof. In accordance with some embodiments, the first active gate stack 120 may further comprise spacers on sidewalls of the gate dielectric layer 120a and the gate electrode layer 120b, the second active gate stack 126 may further comprise spacers on sidewalls of the gate dielectric layer 126a and the gate electrode layer 126b, the first dummy gate stack 122 may further comprise spacers on sidewalls of the gate dielectric layer 122a and the gate electrode layer 122b, and the second dummy gate stack 124 may further comprise spacers on sidewalls of the gate dielectric layer 124a and the gate electrode layer 124b.

In one embodiment, the first active gate stack 120, the second active gate stack 126, the first dummy gate stack 122 and the second dummy gate stack 126 are formed with the same photomask process. Therefore, the materials of the gate dielectric layer 120a, 122a, 124a, 126a are the same, and the materials of the gate electrode layer 120a, 122b, 124b, 126b are the same. The thicknesses of the gate dielectric layers 120a, 122a, 124a, 126a are substantially identical, and the thicknesses of the gate electrode layers 120b, 122b, 124b, 126b are substantially identical.

In accordance with some embodiments, a width W2 of the first dummy gate stack 122 is smaller than a width W1 of the first active gate stack 120. The width W2 of the first dummy gate stack 122 ranges from 40 nm to 130 nm, for example, and the width W1 of the first active gate stack 120 ranges from 500 nm to 10 um, for example. A width W3 of the second dummy gate stack 124 is smaller than a width W4 of the second active gate stack 126. The width W3 of the second dummy gate stack 124 ranges from 40 nm to 130 nm, for example, and the width W4 of the second active gate stack 126 ranges from 500 nm to 10 um, for example. In one embodiment, the first active gate stack 120 overlaps with the first region 106 and does not overlap with the second region 108, but the disclosure does not limit thereto. The second active gate stack 126 overlaps with the third region 110 and does not overlap with the second region 108, but the disclosure does not limit thereto.

The first active gate stack 120 is electrically coupled to a first bias voltage for a LDMOS transistor, and the second active gate stack 126 is electrically coupled to a second bias voltage for the LDMOS transistor. The first bias voltage can be the same to the second bias voltage or different from the second bias voltage. The first dummy gate stack 122 is electrically coupled to a first variable voltage, and the second dummy gate stack 124 is electrically coupled to a second variable voltage. The first variable voltage can be the same to the second variable voltage or different from the second variable voltage. The first variable voltage applied to the first dummy gate stack 122 and the second variable voltage applied to the second dummy gate stack 124 may adjust a resistance of the second region 108 underneath the first dummy gate stack 122 and a resistance of the second region 108 underneath the second dummy gate stack 124. Thus, a breakdown voltage (BVdss) of the LDMOS transistor can be adjusted for different demands. Since the first dummy gate stack 122 is electrically coupled to the first variable voltage and the second dummy gate stack 124 is electrically coupled to the second variable voltage, the resistance of the LDMOS transistor is variable. It is flexible for designers to apply different breakdown voltage (BVdss) for the LDMOS transistor.

Figure 8:
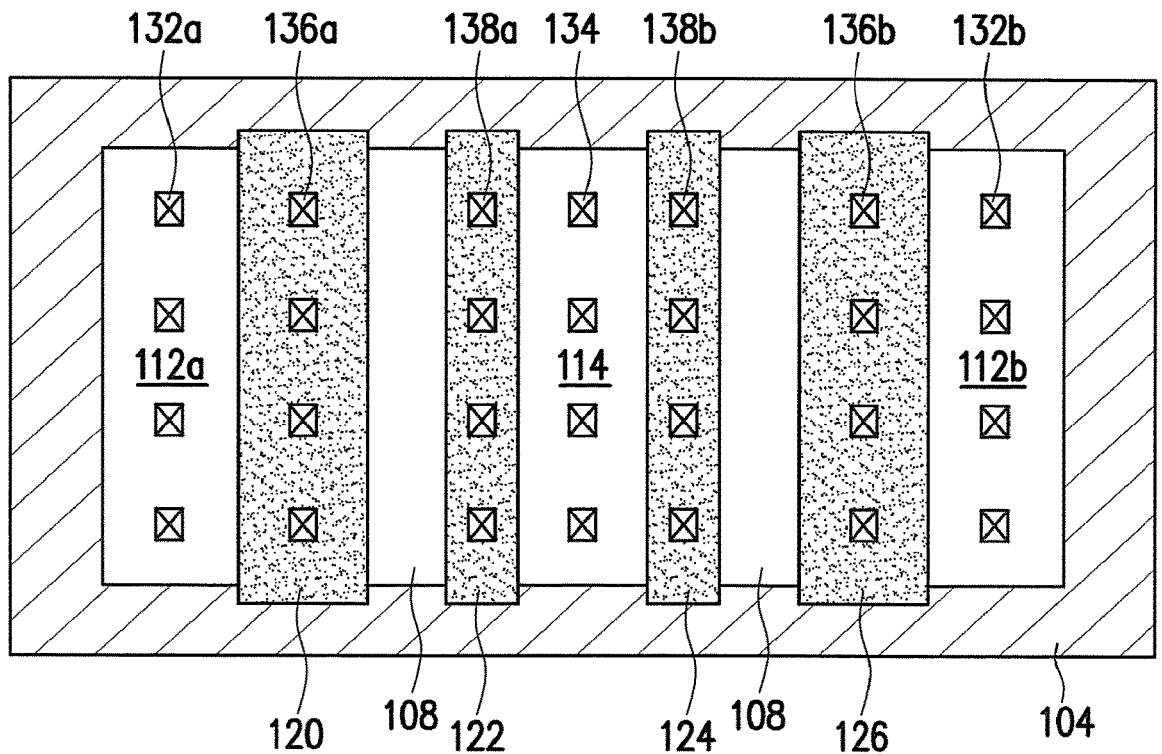
FIG. 8 is a top view of a LDMOS transistor with contact structures in accordance with some embodiments.
Figure 9:
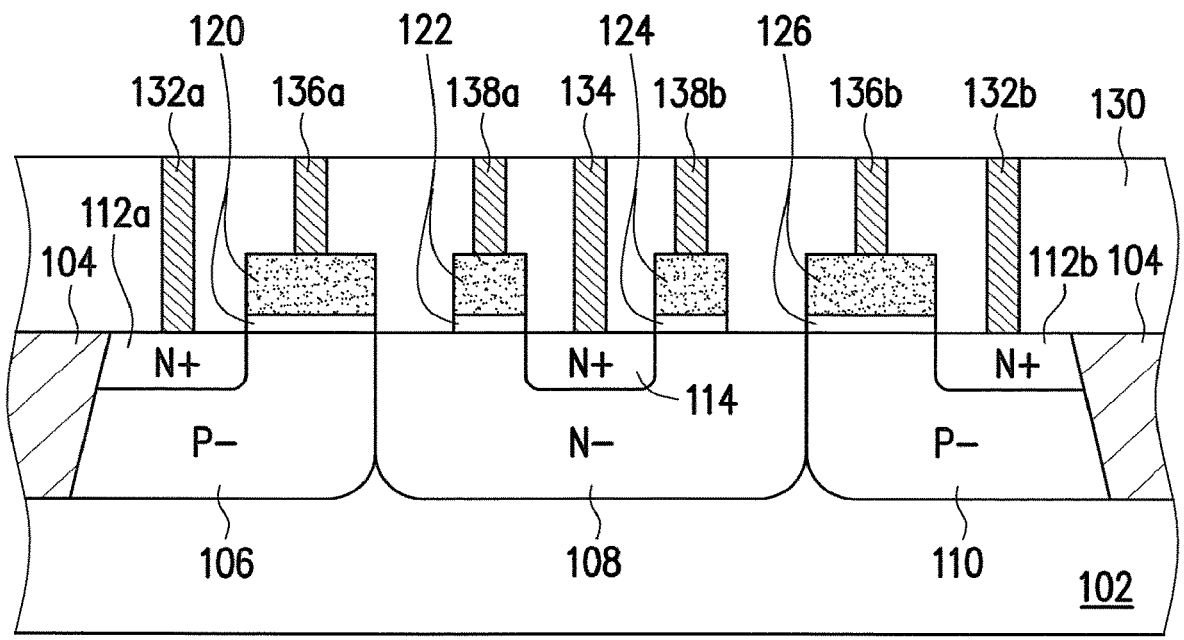
FIG. 9 is a cross-sectional view of a LDMOS transistor with contact structures in accordance with some embodiments.

FIG. 8 is a top view of a LDMOS transistor with contact structures in accordance with some embodiments. FIG. 9 is a cross-sectional view of a LDMOS transistor of FIG. 8. After forming the first active gate stack 120, the second active gate stack 126, and the first dummy gate stack 122 and the second dummy gate stack 124, as shown in FIG. 6 and FIG. 7, an insulating layer 130 is formed over the first source 112a, the second source 112b, the drain 114, the isolator 104, the first active gate stack 120, the second active gate stack 126, the first dummy gate stack 122 and the second dummy gate stack 124. The insulating layer 130 may include silicon oxide, silicon nitride, silicon oxynitride, a spin-on dielectric material, or a low-K dielectric material. The insulating layer 130 may be formed by high-density-plasma chemical vapor deposition (HDP-CVD), sub-atmospheric CVD (SACVD) or by spin-on. Contact structures 132a, 132b, 134, 136a, 136b, 138a, 138b are formed in the insulating layer 130 and may be electrically connect to the first source region 112a, the second source region 112b, the drain region 114, the first active gate stack 120, the second active gate stack 126, the first dummy gate stack 122 and the second dummy gate stack 124, respectively. The contact structures 132a, 132b may be referred as source contacts, the drain structure 134 may be referred as a drain contact, the contact structures 136a, 136b may be referred as gate contacts, and the contact structures 138a, 138b may be referred as dummy gate contacts.

Figure 10:
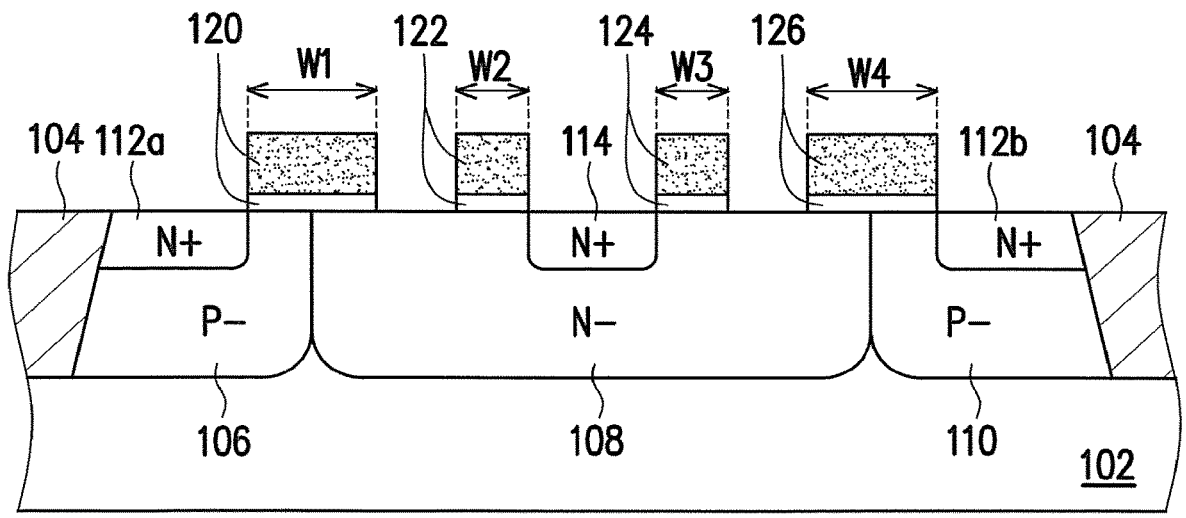
FIG. 10 is a cross-sectional view of a LDMOS transistor in accordance with some embodiments.

FIG. 10 is a cross-sectional view of a LDMOS transistor in accordance with some embodiments. The LDMOS transistor shown in FIG. 10 is a modified embodiment of the LDMOS transistor in FIG. 7. For details, in the LDMOS transistor shown in FIG. 7, the first active gate stack 120 overlaps with the first region 106 and does not overlap with the second region 108, and the second active gate stack 126 overlaps with the third region 110 and does not overlap with the second region 108. However, in the LDMOS transistor shown in FIG. 10, the first active gate stack 120 partially overlaps with the first region 106 and partially overlaps with the second region 108, and the second active gate stack 126 partially overlaps with the third region 110 and partially overlaps with the second region 108.

In accordance with some embodiments of the present disclosure, a MOS transistor includes a substrate, a first region, a second region, a source region, a drain region, an active gate stack, and a dummy gate stack. The substrate has a first conductivity. The first region having the first conductivity is formed in the substrate. The second region having a second conductivity is formed in the substrate, and the second region is adjacent to the first region. The source region with the second conductivity is formed in the first region. The drain region with the second conductivity is formed in the second region. The active gate stack is disposed on the first region. The dummy gate stack is disposed on the second region, and the dummy gate stack is electrically coupled to a variable voltage.

In accordance with some embodiments of the present disclosure, a MOS transistor includes a substrate, a first region, a second region, a third region, a first source region, a drain region, a second source region, a first active gate stack, a first dummy gate stack, a second active gate stack, and a second dummy gate stack. The substrate has a first conductivity. The first region having the first conductivity is formed in the substrate. The second region having a second conductivity is formed in the substrate, and the second region is adjacent to the first region. The third region having the first conductivity is formed in the substrate, and the third region is adjacent to the second region. The first source region with the second conductivity is formed in the first region. The drain region with the second conductivity is formed in the second region. The second source region with the second conductivity is formed in the third region. The first active gate stack is disposed on the first region. The first dummy gate stack is disposed on the second region between the first source region and the drain region, and the first dummy gate stack is electrically coupled to a first variable voltage. The second dummy gate stack is disposed on the second region between the second source region and the drain region, and the second dummy gate stack is electrically coupled to a second variable voltage.

In accordance with some embodiments of the present disclosure, a MOS transistor includes a substrate, a source region, a drain region, a channel region, an extended drift region, an active gate stack, and a dummy gate stack. The substrate has a first conductivity. The source region having a second conductivity is formed in the substrate. The drain region having the second conductivity is formed in the substrate, and the source region and the drain region are separated from each other. The channel region having the first conductivity is formed in the substrate between the source region and the drain region. The extended drift region having the second conductivity is formed in the substrate around the drain region. The active gate stack is disposed on the channel region. The dummy gate stack is disposed on the extended drift region, and the dummy gate stack is electrically coupled to a variable voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A MOS transistor comprising:
   an isolator located on a substrate;
   a channel region and an extended drift region formed within the substrate in an area surrounded by the isolator;
   a source region located in between the channel region and the isolator;
   a drain region located in between the extended drift region and the isolator;
   an active gate stack disposed on the channel region, wherein the active gate stack comprises a gate dielectric layer and a gate electrode layer, and sidewalls of the gate dielectric layer and the gate electrode layer are aligned with a junction between the channel region and the extended drift region; and
   a first dummy gate stack and a second dummy gate stack disposed on the extended drift region and non-overlapped with the drain region, wherein a first sidewall of the first dummy gate stack is aligned with a first side surface of the drain region, and a second sidewall of the second dummy gate stack is aligned with a second side surface of the drain region, wherein the second side surface is opposite to the first side surface, and wherein the extended drift region covers up and contacts the first side surface, the second side surface and a bottom surface of the drain region.

2. The MOS transistor according to claim 1, wherein the active gate stack is coupled to a bias voltage, and the first dummy gate stack and the second dummy gate stack are coupled to a variable voltage.

3. The MOS transistor according to claim 1, wherein a width of the first dummy gate stack and a width of the second dummy gate stack are respectively smaller than a width of the active gate stack.

4. The MOS transistor according to claim 3, wherein the width of the first dummy gate stack and the width of the second dummy gate stack are respectively ranged from 40 nm to 130 nm, and the width of the active gate stack is ranged from 500 nm to 10 um.

5. The MOS transistor according to claim 1, further comprising:
   a gate contact disposed on the active gate stack and electrically connected to the active gate stack; and
   a first dummy gate contact disposed on the first dummy gate stack and electrically connected to the first dummy gate stack; and
   a second dummy gate contact disposed on the second dummy gate stack and electrically connected to the second dummy gate stack.

6. The MOS transistor according to claim 5, further comprising:
   source contact structures disposed on the source region; and
   drain contact structures disposed on the drain region, wherein the active gate stack and the first dummy gate stack are located in between the source contact structures and the drain contact structures.

7. The MOS transistor according to claim 1, further comprising:
   an insulating layer located over the source region and the drain region of the substrate and covering the active gate stack, the first dummy gate stack and the second dummy gate stack.

8. A MOS transistor comprising:
   a first dummy gate stack and a second dummy gate stack electrically coupled to variable voltages;
   an extended drift region located below the first dummy gate stack and the second dummy gate stack;
   a drain region located in the extended drift region in between the first dummy gate stack and the second dummy gate stack, wherein a first sidewall of the first dummy gate stack is aligned with a first side surface of the drain region, a second sidewall of the second dummy gate stack is aligned with a second side surface of the drain region, the second side surface is opposite to the first side surface, and wherein the extended drift region is covering and directly contacting three surfaces of the drain region, and the three surfaces includes the first side surface and the second side surface;
   a drain contact disposed on and directly contacting the drain region, and located in between the first dummy gate stack and the second dummy gate stack, wherein a bottom surface of the drain contact is aligned with a bottom surface of the first dummy gate stack and a bottom surface of the second dummy gate stack;
   a first channel region and a second channel region located on two opposing sides of the extended drift region;
   active gate stacks disposed on and overlapped with the first channel region and the second channel region; and
   a first source region and a second source region located aside the active gate stacks.

9. The MOS transistor according to claim 8, wherein the active gate stacks comprise:
   a first active gate stack disposed on the first channel region, wherein a sidewall of the first active gate stack is aligned with a junction between the first channel region and the extended drift region; and
   a second active gate stack disposed on the second channel region, wherein a sidewall of the second active gate stack is aligned with a junction between the second channel region and the extended drift region.

10. The MOS transistor according to claim 8, wherein the first channel region and the second channel region have a first conductivity, and the extended drift region has a second conductivity.

11. The MOS transistor according to claim 8, wherein widths of the first dummy gate stack and the second dummy gate stack are smaller than a width of the active gate stacks.

12. The MOS transistor according to claim 11, wherein the widths of the first dummy gate stack and the second dummy gate stack are ranged from 40 nm to 130 nm, and the width of the active gate stacks is ranged from 500 nm to 10 um.

13. The MOS transistor according to claim 8, wherein the active gate stacks are non-overlapped with the extended drift region.

14. The MOS transistor according to claim 8, wherein the active gate stacks are further overlapped with the extended drift region.

15. The MOS transistor according to claim 8, further comprising:
   an isolator surrounding the extended drift region, the first channel region and the second channel region; and
   an insulating layer located on the isolator and covering the active gate stacks, the first dummy gate stack and the second dummy gate stack.

16. The MOS transistor according to claim 8, wherein the extended drift region includes a first top surface and a second top surface, and from a top view of the MOS transistor, the first top surface is disconnected and spaced apart from the second top surface, and wherein the first dummy gate stack is directly disposed on the first top surface, and the second dummy gate stack is directly disposed on the second top surface.

17. A method of forming a MOS transistor, comprising:
   forming an isolator on a substrate;
   forming a channel region in the substrate by implanting a first conductivity type material in the substrate;
   forming an extended drift region within the substrate by implanting a second conductivity type material in the substrate, wherein the channel region and the extended drift region are formed within the substrate in an area surrounded by the isolator;
   forming a source region in between the channel region and the isolator by implanting the second conductivity type material in the substrate;
   forming a drain region in between the extended drift region and the isolator by implanting the second conductivity type material in the substrate;
   forming an active gate stack on the channel region, wherein the active gate stack comprises a gate dielectric layer and a gate electrode layer, and sidewalls of the gate dielectric layer and the gate electrode layer are aligned with a junction between the channel region and the extended drift region; and
   forming a first dummy gate stack and a second dummy gate stack on the extended drift region and non-overlapped with the drain region, wherein a first sidewall of the first dummy gate stack is aligned with a first side surface of the drain region, and a second sidewall of the second dummy gate stack is aligned with a second side surface of the drain region, wherein the second side surface is opposite to the first side surface, and wherein the extended drift region covers up and contacts the first side surface, the second side surface and a bottom surface of the drain region.

18. The method according to claim 17, wherein the source region and the drain region are implanted with the second conductivity type material at a higher concentration than the second conductivity type material implanted in the extended drift region.

19. The method according to claim 17, wherein the active gate stack, the first dummy gate stack and the second dummy gate stack are formed with the same photomask process.

20. The method according to claim 17, further comprising:
   forming an insulating layer over the source region and the drain region of the substrate and covering the active gate stack, the first dummy gate stack and the second dummy gate stack.

* * * * *